United States Patent
Takahashi et al.

(10) Patent No.: US 7,089,351 B2
(45) Date of Patent: Aug. 8, 2006

(54) SEMICONDUCTOR MEMORY DEVICE FOR PREVENTING A LATE WRITE FROM DISTURBING A REFRESH OPERATION

(75) Inventors: Hiroyuki Takahashi, Kanagawa (JP); Atsushi Nakagawa, Kanagawa (JP); Hideo Inaba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 27 days.

(21) Appl. No.: 10/479,635

(22) PCT Filed: May 28, 2002

(86) PCT No.: PCT/JP02/05168

§ 371 (c)(1),
(2), (4) Date: Dec. 4, 2003

(87) PCT Pub. No.: WO02/099811

PCT Pub. Date: Dec. 12, 2002

(65) Prior Publication Data
US 2004/0158671 A1 Aug. 12, 2004

(30) Foreign Application Priority Data
Jun. 4, 2001 (JP) .............................. 2001-168686

(51) Int. Cl.
*G06F 12/16* (2006.01)
(52) U.S. Cl. .................. 711/106; 365/222; 711/151; 711/152; 711/158; 710/244

(58) Field of Classification Search ..................... None
See application file for complete search history.

(56) References Cited

U.S. PATENT DOCUMENTS

| | | | |
|---|---|---|---|
| 6,735,140 B1 * | 5/2004 | Fiscus et al. | ................ 365/222 |
| 6,930,945 B1 * | 8/2005 | Takahashi | .................... 365/222 |
| 2001/0017787 A1 | 8/2001 | Hitoshi | |

FOREIGN PATENT DOCUMENTS

| | | |
|---|---|---|
| EP | 1 050 882 A2 | 11/2000 |
| JP | 2001-28190 | 1/2001 |
| JP | 2001-243764 | 9/2001 |

\* cited by examiner

*Primary Examiner*—B. James Peikari
(74) *Attorney, Agent, or Firm*—Muirhead & Saturnelli, LLC

(57) ABSTRACT

A semiconductor memory device is provided for preventing a late-write from disturbing a refresh operation and also for reducing a current consumption in a write cycle with execution of the late-write. Upon a transition of an address ADD, an address transition detector circuit detects this address transition. Upon receipt of a result of detection by the address transition detector circuit, a state control circuit judges an operation to be executed, from an output enable signal /OE and a write enable signal /WE, and then outputs any of a read statement RS, a write statement WS, and a refresh statement FS. According to a clock signal ACLK, input signals such as addresses are taken for executions of operations based on the statements.

8 Claims, 15 Drawing Sheets

SEMICONDUCTOR MEMORY DEVICE FOR PREVENTING A LATE WRITE FROM DISTURBING A REFRESH OPERATION

TECHNICAL FIELD

The present invention relates to a semiconductor memory device configured to have a memory cell array including the same memory cells as of a DRAM (Dynamic Random Access Memory) and also configured to be operable in the same specification as a general-purpose SRAM (static RAM).

BACKGROUND OF THE ART

A pseudo-SRAM has been known, which has a basic element of DRAM and is configured to be so operated as SRAM. The pseudo-SRAM is non-synchronous in view of the specification, which is similar to the conventional SRAM. The pseudo-SRAM is configured to have a basic element of DRAM. The pseudo-SRAM is so configured that operations, such as a refresh operation being unique to DRAM, are automatically performed by the inside thereof.

An example of the conventional non-synchronous semiconductor memory device configured to have a basic element of DRAM will hereinafter be described.

FIG. 1 shows an example of a configuration of the semiconductor memory device of this type. In this drawing, an address ADD is an external signal, and includes a row address designating a row of a memory cell array to be described below and a column address designating a column thereof.

An address input system 1 latches the address ADD and outputs an internal address LADD. An address transition detector circuit (ATD) 2 detects a transition of the internal address LADD and outputs a one-shot pulse signal OSP. An address multiplexer (MUX) 3 outputs, as an address MADD, one of the inputs which include an internal address LADD and a refresh address RADD to be described below.

A row decoder 6 decodes the address MADD for selecting a row of a memory cell array 7. The memory cell array 70 comprises a matrix array of memory cells similar to the general-purpose DRAM. A sense amplifier 71 amplifies a data signal on a bit line for a read operation. A column decoder 72 selects a column of the memory cell array 7. Although not illustrated herein, a precharge circuit for bit lines is provided accompanying the sense amplifier 71.

A refresh timer circuit 8G times a refresh time interval. A refresh control circuit 8H controls a series of refresh operations and generates a refresh control signal REFA for controlling a refresh timing accompanying to an external access and a refresh control signal REFB for controlling a self-refresh timing.

A refresh address generating circuit 8J generates an address RADD (hereinafter referred to as "refresh address") to be used for a refresh operation. An internal pulse generating circuit 9 generates a row enable signal RE, a sense amplifier enable signal SE, a pre-charge enable signal PE and a column enable signal CE.

Other than the above-described circuits, there are further provided a system of circuits for controlling read and write operations, another system of circuits for generating a substrate potential of the memory cell array and still another system of circuits for read and write operations of data to the memory cell array.

The read and write operations and the refresh operation of the semiconductor memory device of the prior art shown in FIG. 1 will, in sequence, be described with reference to a timing chart of FIG. 2.

A. Read and Write Operations

A read operation according to an address access will be described as one example. In this case, a chip select signal ICS and an output enable signal /OE are low, while a write enable signal /WE is high, wherein the address ADD is an externally supplied signal.

The address ADD is an input to the address input system 1 and is latched as an output as the internal address LADD. Except for the refresh, this internal address LADD is supplied as the address MADD as an output of the multiplexer 3 to the row decoder 6. At a timing defined by the row enable signal RE, the row decoder 6 selects one word line in the memory cell array 7, so that data of memory cells connected to this single row of this word line are read out onto respective bit lines. These data signals are amplified by the sense amplifier 71 at a timing defined by the sense amplifier enable signal SE.

On the other hand, based on a column address (not illustrated) included in the address ADD, and at a timing defined by the column enable signal CE, the column decoder 72 selects a bit line of the memory cell array 7, so that data on this bit line is supplied as an external output signal through the data output circuit system (not illustrated). Prior to the operation of reading data from the memory cells, bit lines are pre-charged based on the pre-charge enable signal PE.

In the above-described series of read operations, a transition of the internal address LADD is detected by the address transition detector circuit 2 which outputs a one-shot pulse signal OSP. By triggering this one-shot pulse signal OSP, the internal pulse generating circuit 9 outputs, at appropriate timings, the above-described row enable signal RE, the sense amplifier enable signal SE, the pre-charge enable signal PE and the column enable signal CE.

Consequently, the data is read out of the memory cell designated by the address ADD and supplied to the outside.

B. Refresh Operation (in Read Mode)

A refresh operation in a read mode as one of the active modes will subsequently be described with reference to a timing chart shown in. FIG. 2(a).

In the read mode, the semiconductor memory device according to this conventional technique shows a sequential performance of both the refresh operation and the read operation in the same cycle in accordance with the specification.

The address input system 1 latches an external input address signal A0 as the address ADD and then outputs the internal address LADD. The address transition detector circuit 2 detects a transition of the internal address LADD and outputs the one-shot pulse signal OSP.

Upon receipt of the one-shot pulse signal OSP, the refresh control circuit 8H starts the refresh operation. Upon the start of the refresh operation, the refresh address generator circuit 8J generates and outputs a refresh row address RO as the refresh address RADD. Under the control of the refresh control circuit 8H, the address multiplexer 3 supplies the refresh address RADD (the refresh row address RO) as the address MADD to the row decoder 60.

On the other hand, the internal pulse generating circuit 9 receives an input of the refresh control signal REFB from the refresh control circuit 8H, and outputs the row enable signal RE and the sense amplifier enable signal SE. The row decoder 6 receives inputs of the address MADD and the row enable signal RE and selects a word line designated by the refresh address RO for a predetermined time period defined by the row enable signal RE. Data signals of the memory cells connected to the selected word line are amplified by the sense amplifiers and then re-stored therein, whereby the data of the memory cells for the single row designated by the refresh address RO have been refreshed.

After the refresh operation has been finished for the row designated by the refresh row address RO, then the read operation is made in the same cycle. For example, the address multiplexer 3 receives the internal address LADD from the address input system 1 and supplies the internal address LADD as the address MADD to the row decoder 6. The row decoder 6 selects the word line designated by the row address X0 entered as the input address MADD. The sense amplifier 71 amplifies the data signal appearing on the bit line in the memory cell array 7. The amplified data is provided as an external output through a data output circuit (not illustrated).

C. Refresh Operation (in Stand-by Mode)

A refresh operation in a stand-by mode will be described with reference to a timing chart shown in FIG. 2(b). In the stand-by mode, the refresh control circuit 8H measures an amount of time which has occurred from a time of the last external request for access, so that if the the amount of time exceeds a predetermined refresh time, then the refresh control circuit 8H outputs the refresh control signal REFB to start the self-refresh operation.

In the above-described active mode, after the refresh operation accompanying the read and write operation, the refresh control circuit 8H starts the timer. After the predetermined time has elapsed, the refresh is automatically started by triggering the timer. In either the stand-by mode or the active mode, the retention of the data is ensured without starting the refresh from the outside, similarly to the general-purpose SRAM.

Meanwhile, with the pseudo-SRAM in accordance with the above-conventional technique, it is necessary to pre-charge the bit line for a subsequent access until a predetermined time (hereinafter referred to as a recovery time TWR) from a time when the write enable signal is inactivated after the write operation to the memory cell has been made. Accordingly, it is difficult for the pseudo-SRAM that the recovery time TWR becomes zero. The pseudo-SRAM of this conventional technique maintains the write operation to the memory cell in a time period that the write enable signal is in the active state, for which reason in this time period, the refresh can be executed.

For the pseudo-SRAM, a write cycle time TWP has an upper limit of a write cycle time TWP for the refresh operation.

The pseudo-SRAM has strict limitations to the recovery time and the write cycle time, and is different in the specification from the general-purpose SRAM.

A data write method referred to herein as a "Late Write" has been presented for removing the limitations on the specification.

This late write will, hereinafter, be described briefly. In the memory cycle with an externally given request for the write access, a given write address and a given write data are taken into the semiconductor memory device, while those write address and write data as taken will be retained in the inside of the semiconductor memory device until the next request for write operation is entered. The write operation to the memory cell is not executed in this memory cycle, but will be executed in a future memory cycle of the entry of the next request for the write operation to the memory cell. The late write is that the write operation to the memory cell is delayed to the memory cycle of the entry of the next request for the write operation.

In accordance with the late write, it is unnecessary to write data into the memory cell within the memory cycle when these write data have been taken, for which reason it is unnecessary to pre-charge the bit line after the write operation, thereby allowing the recovery time TWR to be zero similarly to the general-purpose SRAM. In the later memory cycle that the data are written into the memory cell, the write address and the write data have already been taken, for which reason the activation of the write enable signal causes a prompt start the write operation to the memory cell. After the data write operation to the memory cell has been made, then it is unnecessary to maintain the word line to be selected even in the write cycle. This allows allocating a subsequent time period for the refresh. This further makes it unnecessary to limit the write cycle time for ensuring the refresh operation.

With the use of the late cycle, it is possible for the pseudo-SRAM to operate similarly to the general-purpose SRAM.

In accordance with the above-described late write, however, it is possible, in case, that a series of the refresh operation, the read operation and the write operation appears in a later memory cycle than the cycle of the actual write operation, thereby disturbing subsequent operation in the next memory cycle.

This problem will be described concretely with reference to FIG. 3. FIG. 3 shows a timing of writing data (not illustrated) to addresses A1.about.A3.

In the initial state, the write enable signal /WE is high, and the operation mode is the read mode. At a time t110, an address ADD is transitioned to an address A1. At a time t112, the write enable signal /WE transitions to low, whereby data externally designated in the current or present cycle is taken as well as previous data having already been taken in the previous cycle are stored in late-write to the memory cell.

At the time t110, the transition of the address ADD occurs, whereby the refresh is executed. At a time t111, the refresh is finished, whereby the read operation is started. Once the read operation has been started, it is prohibitive to interrupt the read operation in view of protecting the data. The above-described late write operation of the data will wait for the read operation to be completed. As a result, the late write, which should be executed in the write cycle to the address A1, is interrupted into the other write cycle to the next address A2, thereby disturbing the refresh in this next write cycle.

In accordance with this example, in the write cycle to the address A1, a series of the refresh operation, the read operation and the write operation is executed, thereby causing an increased consumption of current.

The present invention has been made in view of the above-circumstances. An object of the present invention is to provide a semiconductor memory device allowing the refresh operation to be free from any interruption by the late write and reducing a current consumption in a write cycle having the late write operation.

DISCLOSURE OF THE INVENTION

In order to solve the above-described issues, the present invention provides a semiconductor memory device having a memory cell array comprising memory cells which need refresh and receiving asynchronously a write request and write data together with an access address, wherein the semiconductor memory device comprises an access means for executing a refresh of said memory cell array subsequently to a write cycle to the access address; a write control means for rendering said access means perform a late write operation, using said access address and said write data given in said memory cycle, after a memory cycle in which said write request has been given; and a read inhibit control means for inhibiting a read operation based in an output enable signal in said write cycle having said execution of said late write operation.

In accordance with the present invention, the semiconductor memory device is also so configured as to output retained data which is to be written through said late write operation if said output enable signal is activated without any transition of said access address in said write cycle having said execution of said late write operation.

In accordance with the present invention, the semiconductor memory device is also so configured as to read out data from a memory cell subject to an access in a page mode by triggering an output enable signal in the write cycle.

In accordance with the present invention, the semiconductor memory device is also so configured as to read out data from a memory cell designated by the current cycle prior to a refresh in a cycle free of any read operation.

BRIEF DESCRIPTIONS OF DRAWINGS

BEST MODE FOR CARRYING OUT THE INVENTION

The embodiments of the present invention will be described with reference to the drawings.

A semiconductor memory device in accordance with the first embodiment is a pseudo-SRAM configured to perform a refresh operation and a read or write operation in the same cycle, and to allow a late-write operation.

Figure 1:
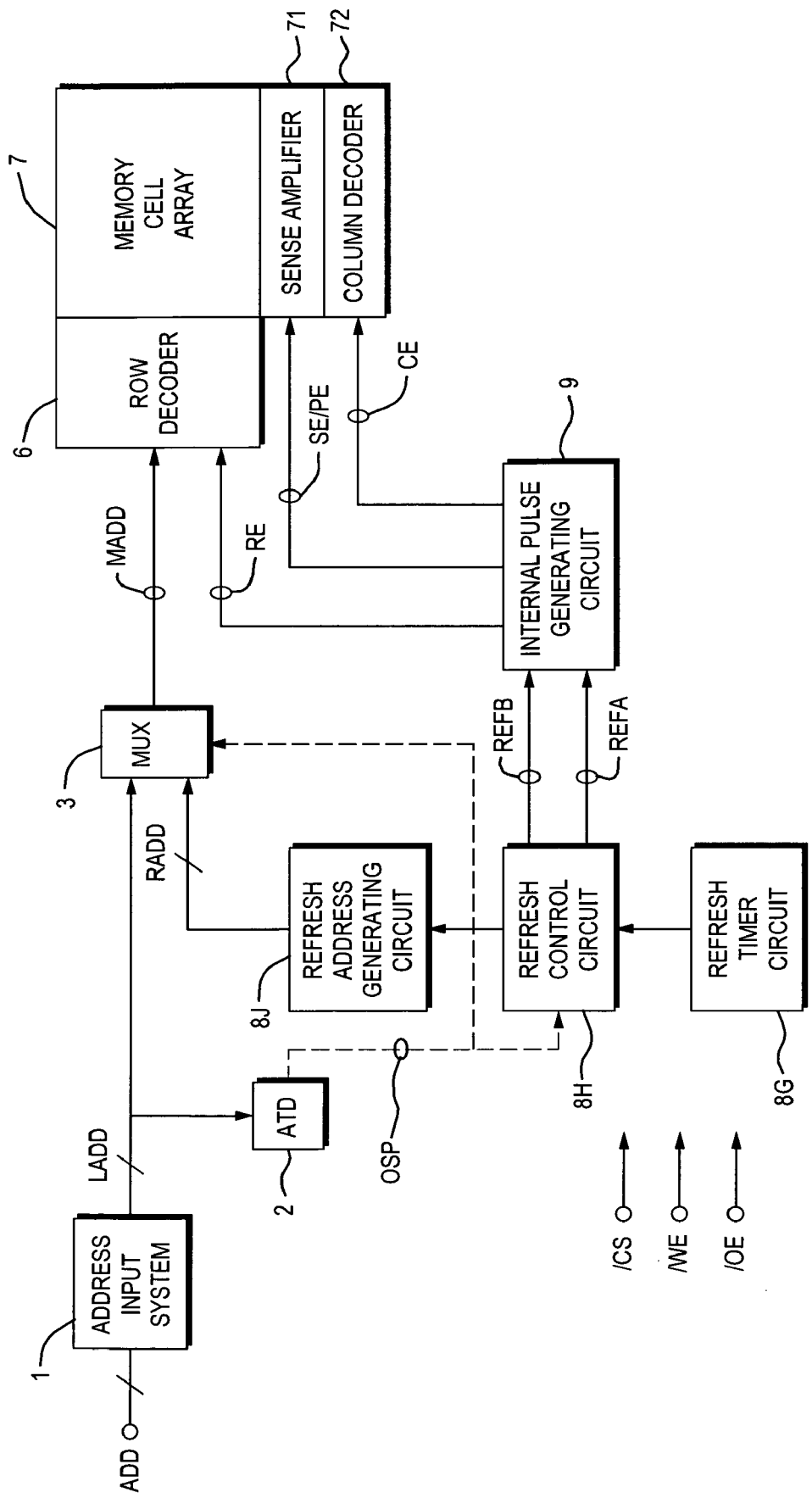
FIG. 1 is a block diagram illustrative of an example of a configuration of a semiconductor memory device (pseudo-SRAM) in accordance with the prior art.
Figure 2A:
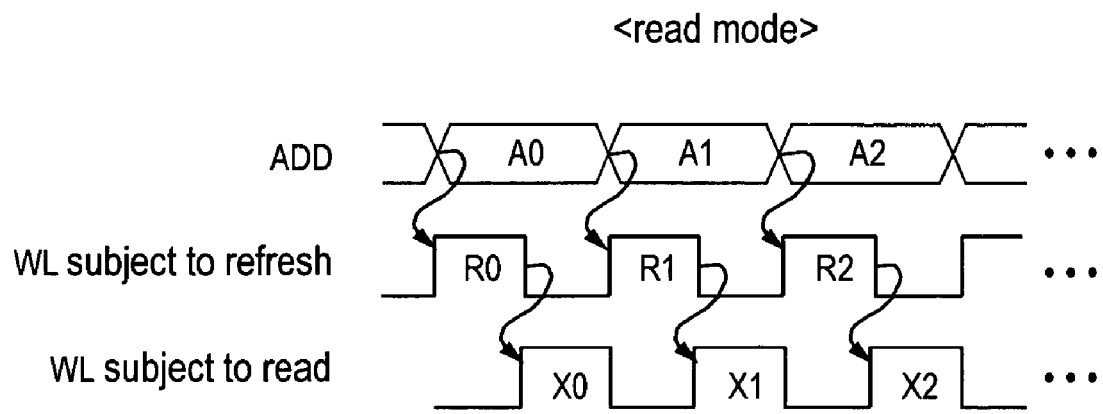
FIG. 2 is a timing chart describing a refresh operation of the semiconductor memory device (pseudo-SRAM) in accordance with the prior art.
Figure 2B:
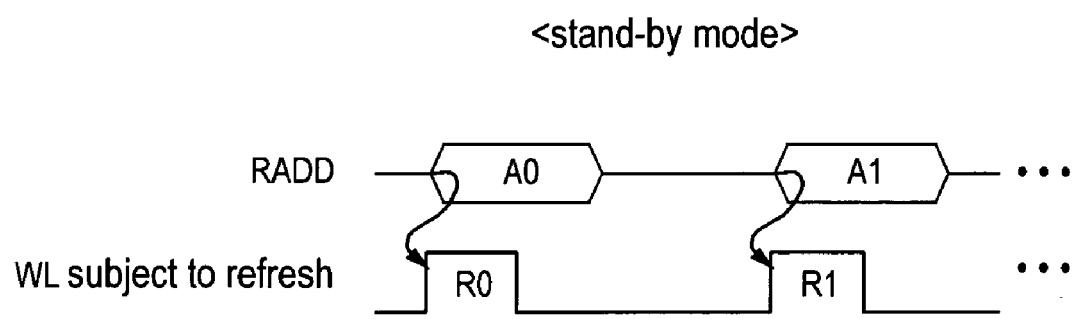
Figure 3:
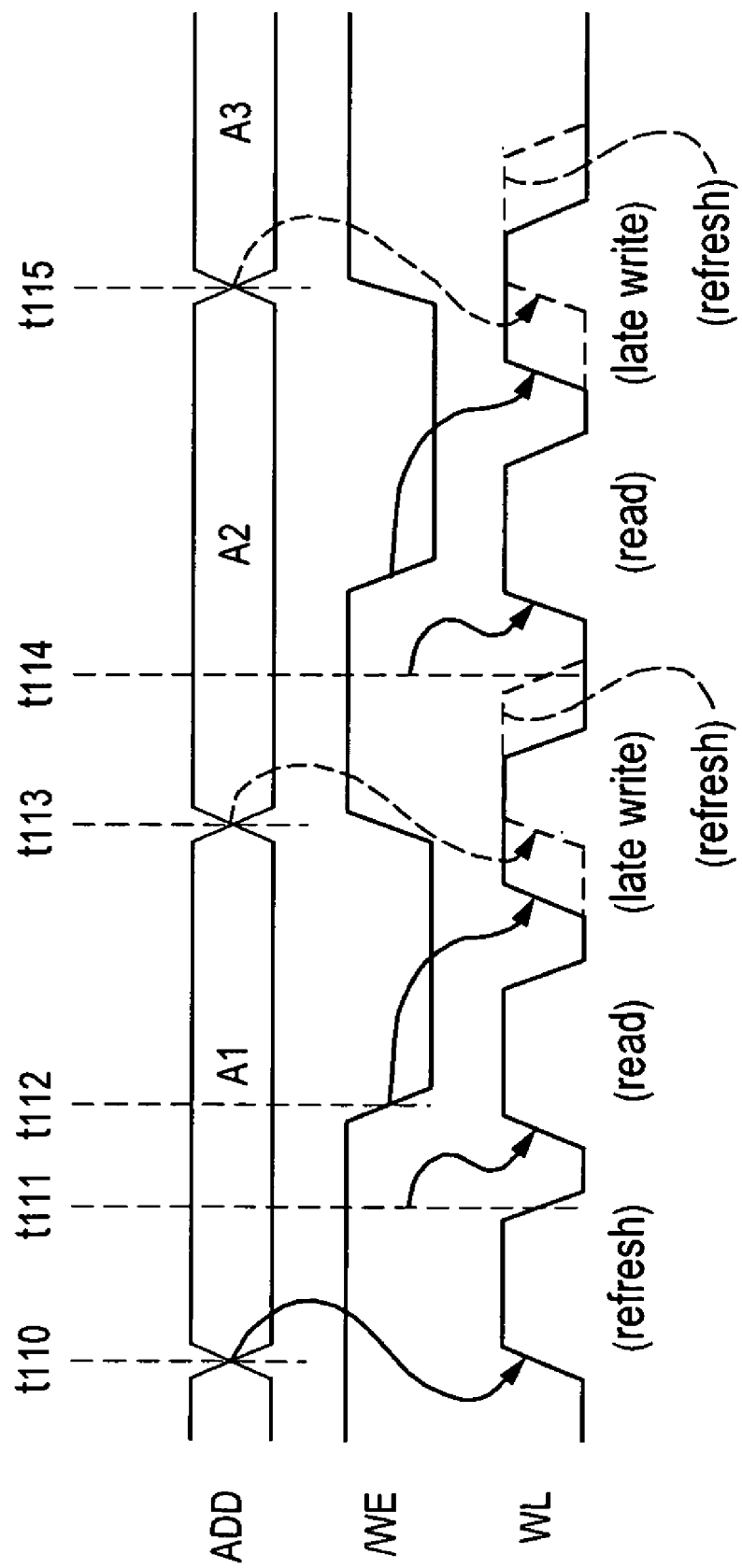
FIG. 3 is another timing chart describing a problem with the operation of the semiconductor memory device (pseudo-SRAM) in accordance with the prior art.

As long as this point of view is concerned, the semiconductor memory device has the same configuration as that of the prior art shown in FIG. 1.

Main features of the semiconductor memory device in accordance with the embodiment of the present invention will, hereinafter, be described prior to descriptions of the configuration and operation thereof.

(A) First Feature

The first feature is to have a function of inhibiting any read operation in a late write cycle. This first feature is to solve the issue engaged with the above-described prior art. In accordance with this first feature, an output enable signal /OE is controlled to be high in the write cycle for inhibiting a read operation subsequent to refresh.

Figure 4:
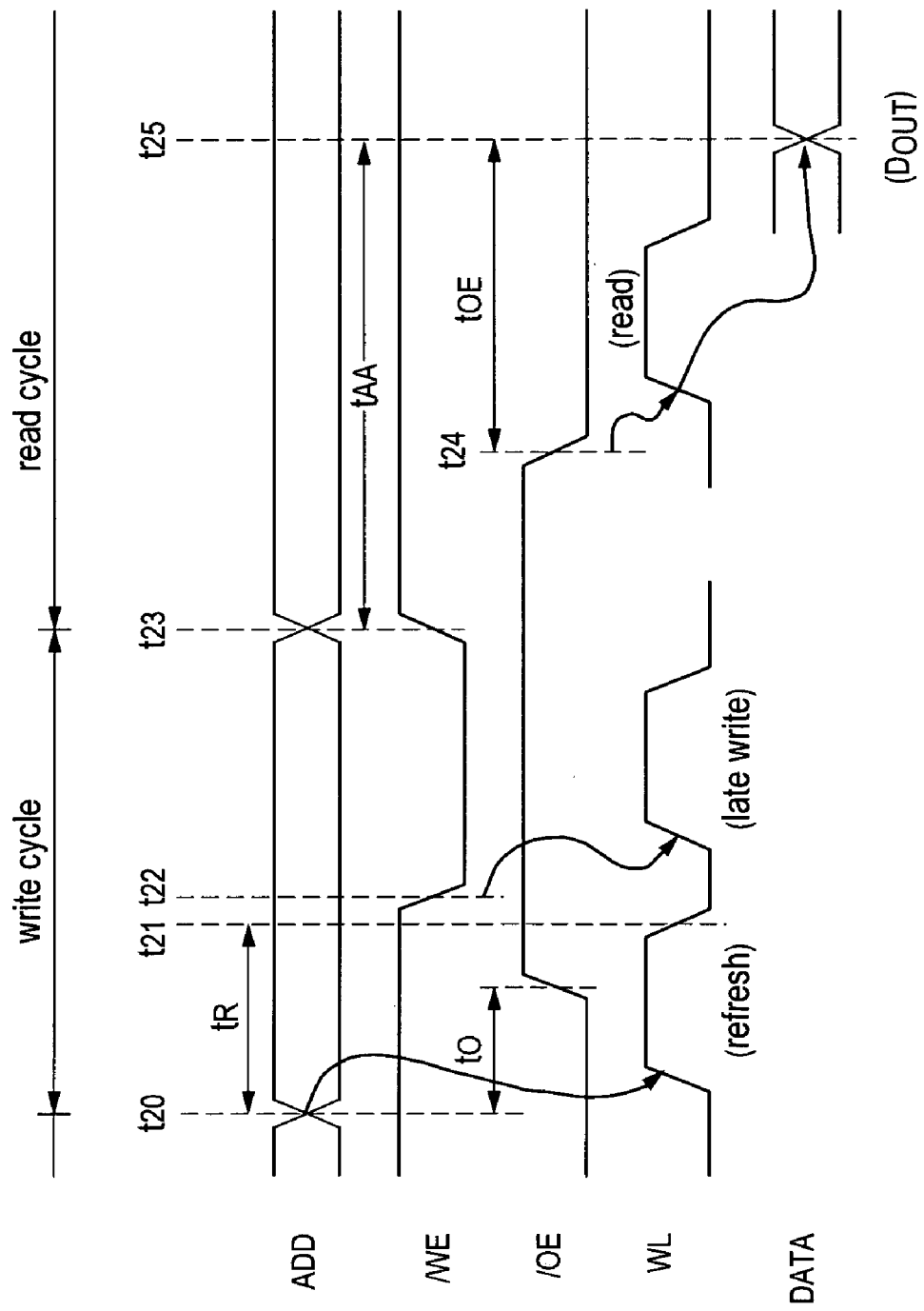
FIG. 4 is a timing chart describing a first feature of a semiconductor memory device in accordance with the present invention.

Concrete descriptions will be made with reference to FIG. 4. In an initial state prior to a time t20, the write enable signal /WE and the output enable signal /OE are high and low respectively, wherein the semiconductor memory device is in the read mode. At the time t20, a transition of the address ADD is caused to start a write cycle. Upon this address transition, the word line WL is selected for refresh subsequent to the write operation.

At a time when a time t0 has past from the time t20, the output enable signal /OE transitions to high, wherein the time t0 is set to a value smaller than a time tR which is defined from the time t20 to a time t21 when the refresh is finished, whereby the output enable signal /OE is inactivated in the period of time of the refresh. Namely, the time t0 defined from the time t20 of starting the write cycle through the time t0 of transitioning the output enable signal /OE to high to satisfy the condition of t0<tR. This condition is defined as the specification. The definition of the output enable signal /OE causes that even when the write enable signal /WE is high, then no read operation is started after the refresh has been made, thereby inhibiting this read operation.

Subsequently, at a time t22, the write enable signal /WE becomes low, whereby the late write is executed to cause the data having been taken in the previous write cycle to be written into the memory cell. At a time t23, the write enable signal /WE becomes high, data externally designated in this write cycle is taken for a late cycle to be executed in a later write cycle. In this example, the address is also transitioned together with the write enable signal /WE, whereby a recovery tWR is set zero.

At a time t23, the address ADD is transitioned to start the read cycle. Assuming that the semiconductor memory device is the general-purpose SRAM, then even the output enable signal /OE is high, then the operation of reading data out of the memory cell is executed, and the data are placed in the final-stage output buffer. In contrast, in accordance with the semiconductor memory device of this embodiment, the high output enable signal /OE ensures no read operation is started for the reason described elsewhere herein.

At a time t24, the output enable signal /OE becomes low, thereby starting the read operation for activating the word line. At a time t25 when a time tOE has past from the time t24, output data DOUT as data DATA is provided as an external output. In this example, the output of the output data DOUT is caused at a time which corresponds to an address access time tAA.

The above-described first feature ensures inhibiting the read operation in the write cycle. Accordingly, in this write cycle, two times of operation of selecting the word line are necessary for executing the refresh and the late-write. This ensures that the late-write does not interrupt the operation in the next cycle.

(B) The Second Feature

The second feature is to have a function of reading the correct data even if no transition of the address is caused after the late-write.

Prior to the descriptions of this second feature, the read operation according to the prior art will be described with reference to FIG. 5, wherein no address transition is caused after the late write.

Figure 5:
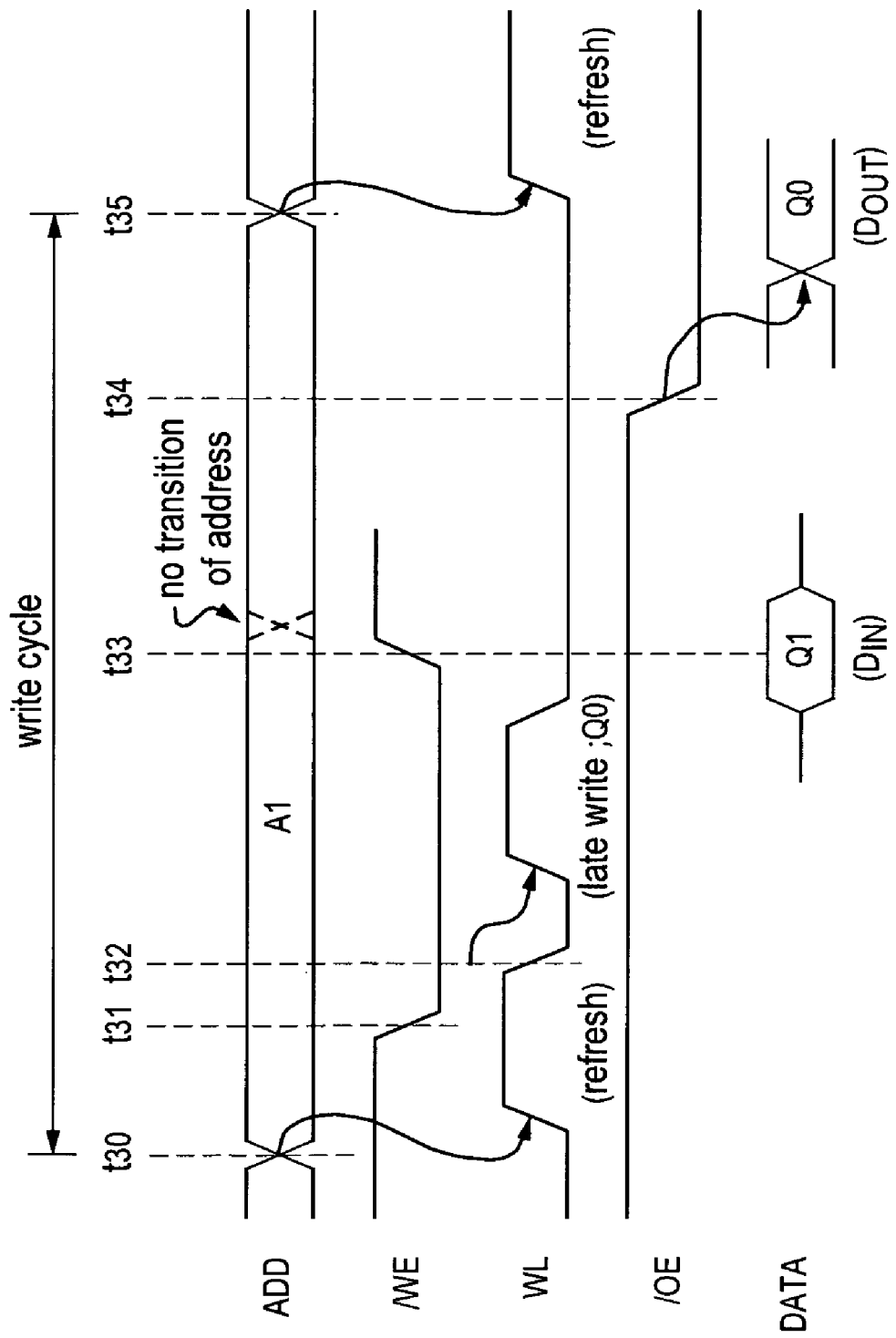
FIG. 5 is a timing chart describing operations a semiconductor memory device in accordance with the present invention, assuming that a second feature of the semiconductor memory device is absent.

In FIG. 5, at a time t30, a transition of the address ADD starts the write cycle, whereby upon the address transition, the refresh is executed. At a time t32, the refresh is finished, whereby the inhibition to the read operation is caused by the above-described first feature, and data Q0 taken in the previous write cycle are written into the memory cell in the late-write.

At a time t33, the write enable signal /WE becomes high, whereby input data Q1 are taken, which have been externally designated as data DARA, for a late-write to be executed in the next write cycle. If no transition of the address ADD is caused and the output enable signal /OE becomes low at a time t34, then data Q0 is output to the outside, which is subject to the late-write in this write cycle.

In view of the outside, data Q0 is designated in this write cycle, for which reason the data Q0 should be output by the read operation without any transition of the address. In accordance with the late-write, as described-above, data having been taken in the previous write cycle is written into the memory cell, whereby data Q0 different from the last-designated data Q1 is output. This means that the incorrect data is read out. Accordingly, the introduction of the late-write needs a different specification from the general-purpose SRAM.

Taking into account the above-described read operation according to the prior art, the second feature of this embodiment will, hereinafter, be described with reference to FIG. 6.

This second feature is to solve the problem with the above-described non-correspondence of data. If a request is made for a read out operation based on the output enable signal /OE without any address transition in the write cycle, then data which is intended to be written in the late-write and is held in a register, will be output to the outside with by-passing a normal system of circuits such as the memory cell and the sense amplifier.

Figure 6:
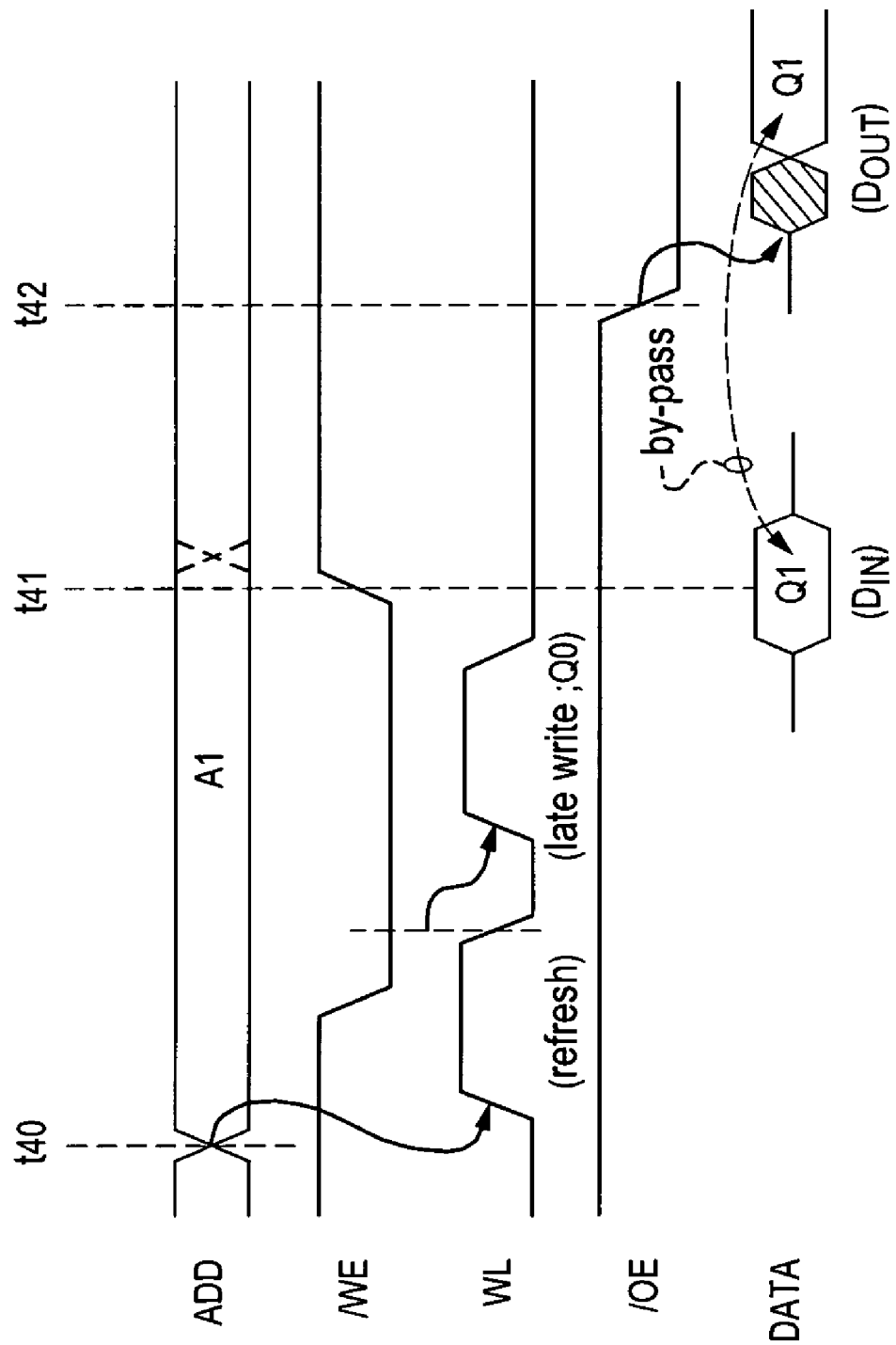
FIG. 6 is a timing chart describing a second feature of a semiconductor memory device in accordance with the present invention.

Namely, in FIG. 6, at a time t40, a transition of the address ADD is caused, whereby similarly to the above-described case shown in FIG. 5, upon the address transition, the refresh and the late-write are executed, resulting in that the data Q0 having been taken in the previous write cycle will be written into the memory cell. At a time t41, the write enable signal /WE goes high, so that data Q1 currently designated as external will be taken for preparation to the late-write in the next write cycle.

Thereafter, no address transition is caused and the output enable signal /OE becomes low, whereby the data Q1 taken at the time t41 will be output from the register holding the data through an output buffer, wherein the normal data path is cut in order to avoid any interference between the data Q0 subject to the late-write and the data Q1.

In order to realize this function, as described below, there are provided a judgement circuit for detecting the absence of the address transition, a by-pass circuit for allowing data output to by-pass the normal system of circuits and a data-in register for holding data as designated externally.

The above-described second feature allows reading out the data finally and externally designated even in the read operation without any address transition after the write operation, thereby allowing the read operation over the same specification as the general-purpose SRAM.

(C) The Third Feature

The third feature is to have a function of reading (page-reading), in page mode, correct data even if no address transition is caused after the late-write.

Prior to the descriptions for the third feature, the page read operation free of this third feature will be described with reference to FIG. 7.

At a time t50, a transition of the address ADD is caused, whereby similarly to the above-described case shown in FIG. 6, upon the address transition, the refresh and the late-write are executed, and data Q0 taken in the previous write cycle will be written into the memory cell. At a time t51, the write enable signal /WE becomes high, data Q1 currently designated as external will be taken to set the data Q1 in a data-in register Dr for preparation to the late-write in the next cycle. Thereafter, no address transition is caused, and at a time t52, the output enable signal /OE becomes lo, whereby the data Q1 taken at the time t51 will be output from the data-in register DR through the output buffer to the outside. These operations are based on the above-described second feature.

Subsequently, at a time t53, transitions of a column address are caused so that the address ADD shows sequential address transitions A2.about.A4. Data is read from columns sequentially designated according to the column addresses, wherein the data is not read from the memory cells but simply data (NG) residual on the data bus is read. This means that the read data is not true data, but incorrect data is read out. It is possible to access the memory cell upon an address transition at start for the page read, but it is necessary to distinguish it from the normal read after the refresh. This means it impossible to achieve a high speed access which is the feature of the page read.

Taking into account the above-described page read operation, the third feature of this embodiment will, hereinafter, be described with reference to FIG. 8.

This third feature is to solve the problem with the above-described page read. If no address transition is caused in the write cycle and a request is made for a read operation based on the output enable signal /OE, then parallel read operations of data subject to the page read will be made for sequential outputs thereof.

Figure 7:
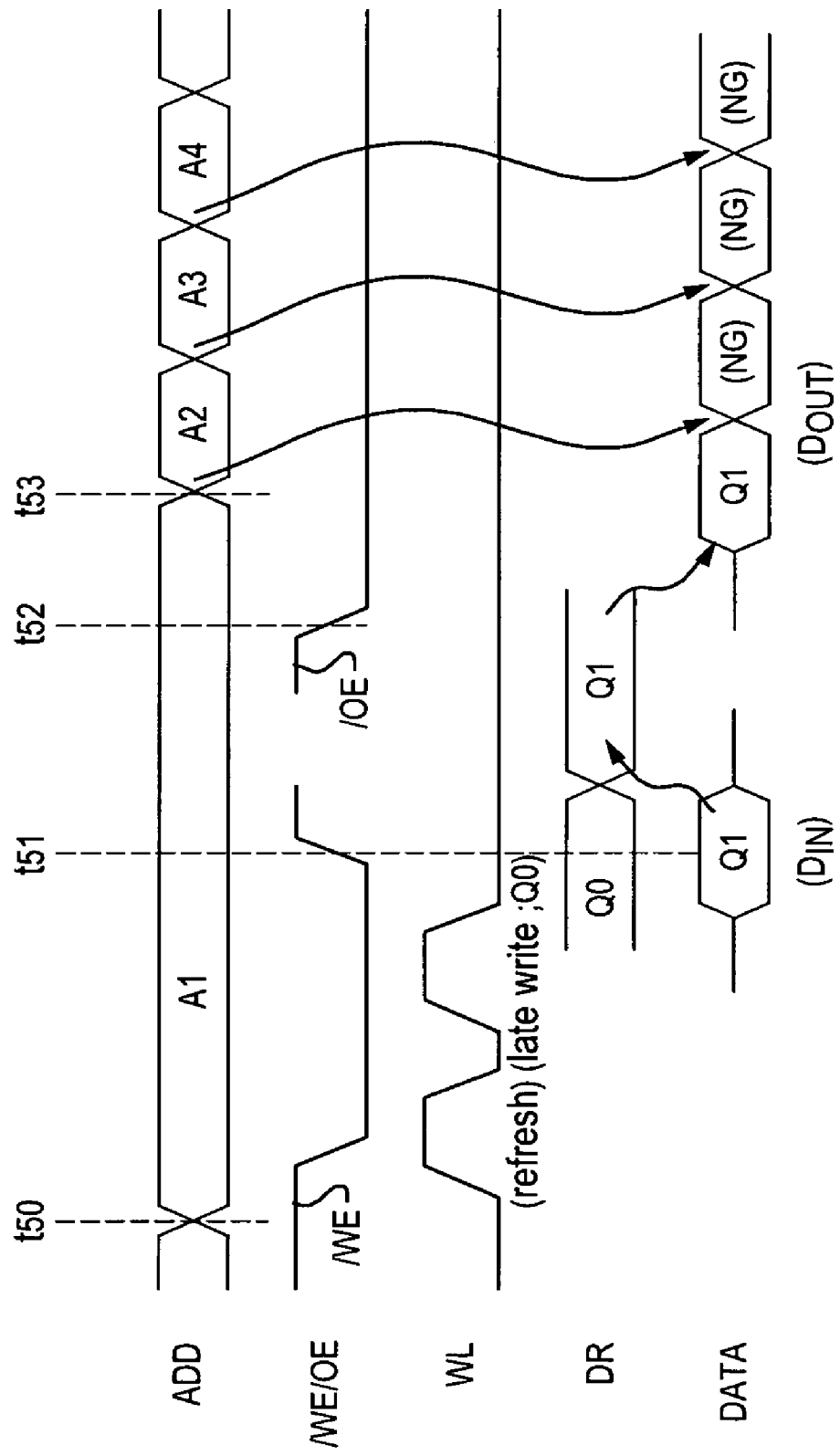
FIG. 7 is a timing chart describing operations a semiconductor memory device in accordance with the present invention, assuming that a third feature of the semiconductor memory device is absent.
Figure 8:
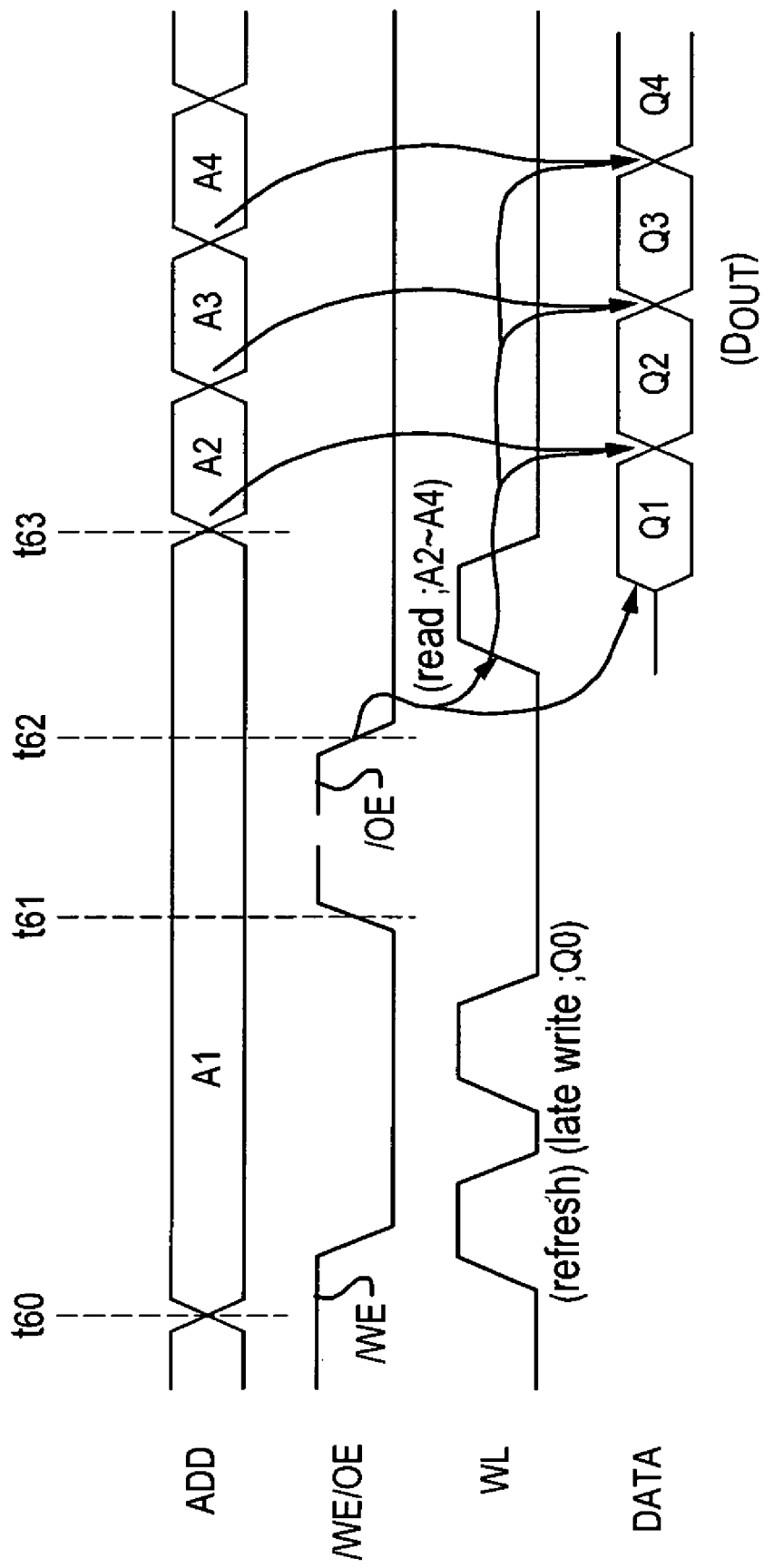
FIG. 8 is a timing chart describing a third feature of a semiconductor memory device in accordance with the present invention.

In FIG. 8, at a time t60, the address ADD is transitioned to an address A1, whereby similarly to the above-described case shown in FIG. 7, upon this address transition, the refresh and the late-write are executed, so that the data Q0 having been taken in the previous write cycle will be written into the memory cell. At a time t61, the write enable signal /WE becomes high level, data Q1 being currently designated externally will be taken (not illustrated) for preparation of a late-write in the next cycle.

Thereafter, no address transition is caused and at a time t62, the output enable signal /OE becomes low, whereby the data Q1 taken at the time t61 will be output from the data-in register through the output buffer to the outside as data for the address A1. Upon transition of the output enable signal /OE, data is read in parallel from columns corresponding to addresses A2–A4 subsequent to the address A1 and then stored in the data register. At a time t63, the address ADD is transitioned to the addresses A2–A4, whereby data corresponding to those addresses will sequentially be output from the above-described data register to the outside.

The above-described third feature allows a correct read operation of a series of the data including the externally last-designated data even if the page read is executed in the absence of the address transition after the write operation.

(D) The Fourth Feature

The fourth feature is to have a function of a high speed read operation based on the output enable signal /OE even during the refresh.

Figure 9:
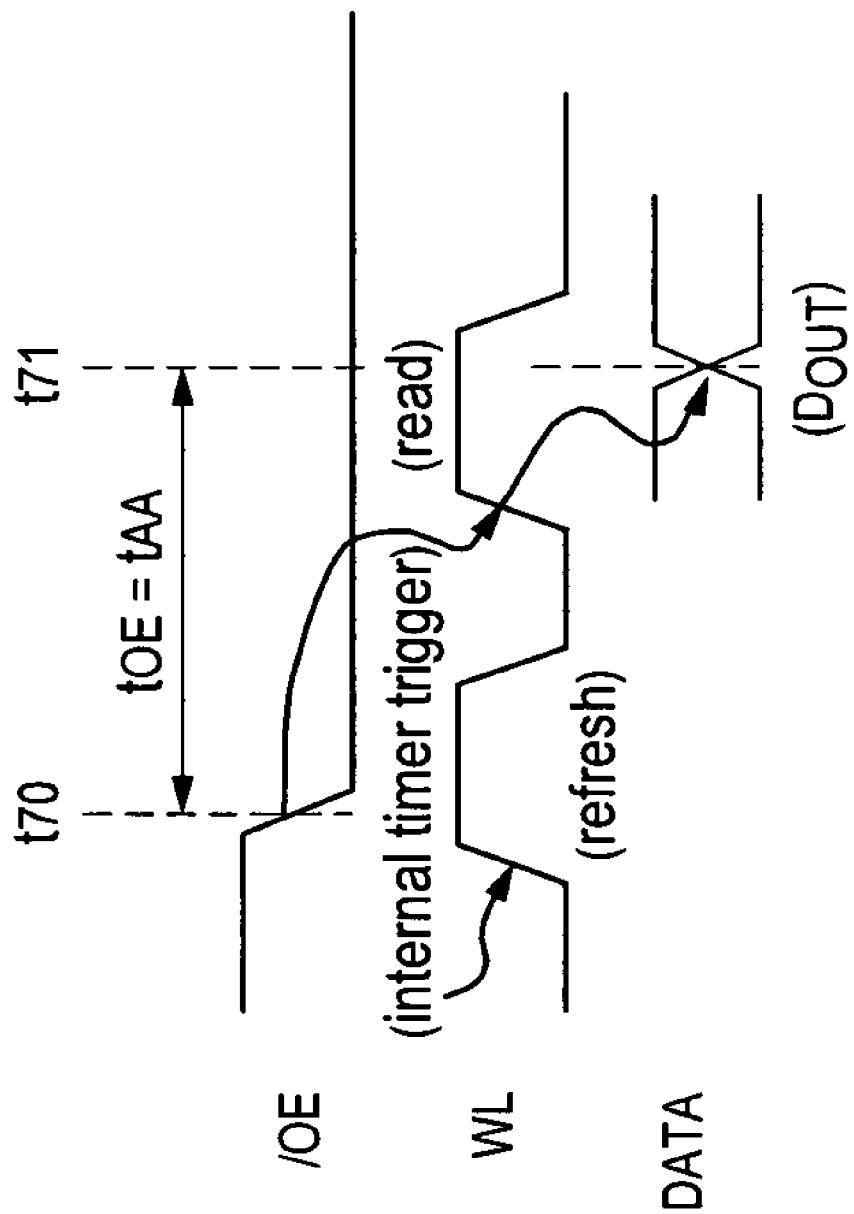
FIG. 9 is a timing chart describing operations a semiconductor memory device in accordance with the present invention, assuming that a fourth feature of the semiconductor memory device is absent.

Prior to the descriptions for the fourth feature, the read operation free of this fourth feature will be described with reference to FIG. 9.

At a time t70, a transition of the address ADD is caused, whereby similar to the above-described first through third features, the read operation is executed based on the output enable signal /OE. If at the time t70, the refresh is being executed by triggering an internal timer, then the read operation will wait for the finish of the refresh. At a time t71, data DOUT is output as data DATA. In this case, a read out time tOE based on the output enable signal /OE is delayed as closely to the address access time tAA.

Taking into account the above-described read operation based on the output enable signal, the fourth feature of this embodiment will, hereinafter, be described with reference to FIG. 10.

This fourth feature is to solve the problem with the above-described read operation based on the output enable signal. If the refresh is executed by triggering the internal timer in a cycle free of any data read operation from the memory cell, then the refresh operation follows the data read operation from the memory cell.

Figure 10:
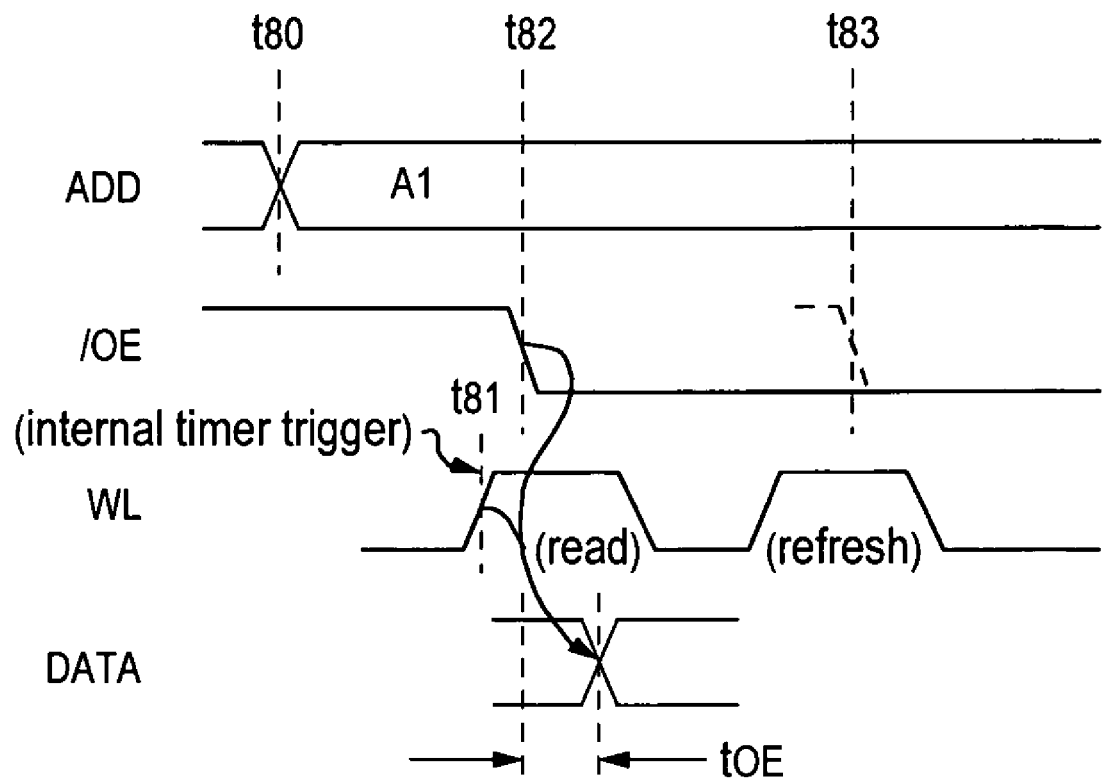
FIG. 10 is a timing chart describing a fourth feature of a semiconductor memory device in accordance with the present invention.

In FIG. 10, at a time t80, the address ADD is transitioned to an address A1, whereby the output enable signal /OE becomes low, so that a read operation of the data DATA will be executed. At a time t81, immediately before the output enable signal /OE becomes low, the refresh is executed by triggering the internal timer, but after the read operation has been executed for the address A1. The read operation is executed by triggering the internal timer before the refresh is then executed.

If a request for the refresh by triggering the internal timer is made just before the output enable signal /OE becomes low, then the data DATA is promptly output through this read operation because the read operation has already been started at the time the output enable signal /OE goes low. Accordingly, the read operation can be made with keeping the potential high speed performance.

If at a time t83, the output enable signal /OE goes low during the refresh, then the read operation has been executed and the data to be read out has been defined, for which reason the high speed read operation can be made.

Figure 11:
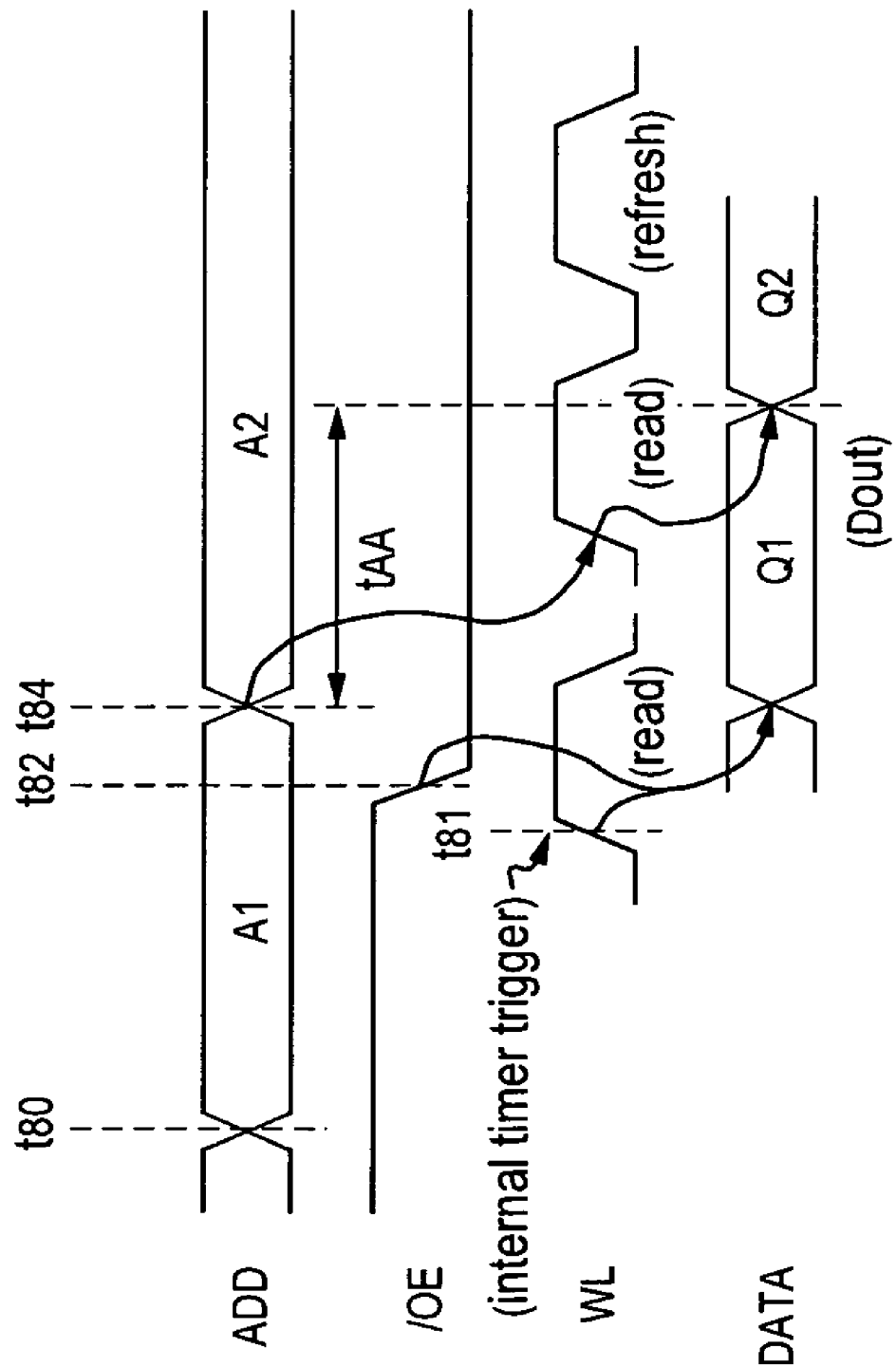
FIG. 11 is a timing chart describing operations a semiconductor memory device in accordance with the present invention, assuming that the semiconductor memory device has an extension of the fourth feature.

The following descriptions will be made in case that the transition of the address ADD is caused just after the read operation has been executed by triggering the internal timer. In this case, as shown in FIG. 11, immediately after the operation has been started at a time t81, then at a time t84, the address ADD is transitioned from the address A1 to the address A2, whereby the read operation will be executed for the address A2 with the priority over the refresh operation. Namely, at the time t81, the read operation for the address A1 is executed by triggering the internal timer for causing the data Q1 to be output before the read operation for the address A2 is then executed causing the data Q2 to be output, whereby no delay is caused on the access time tAA to the address A2.

The first through fourth features of the semiconductor memory device in accordance with this embodiment have been described above.

(Configuration and Operation)

Figure 12:
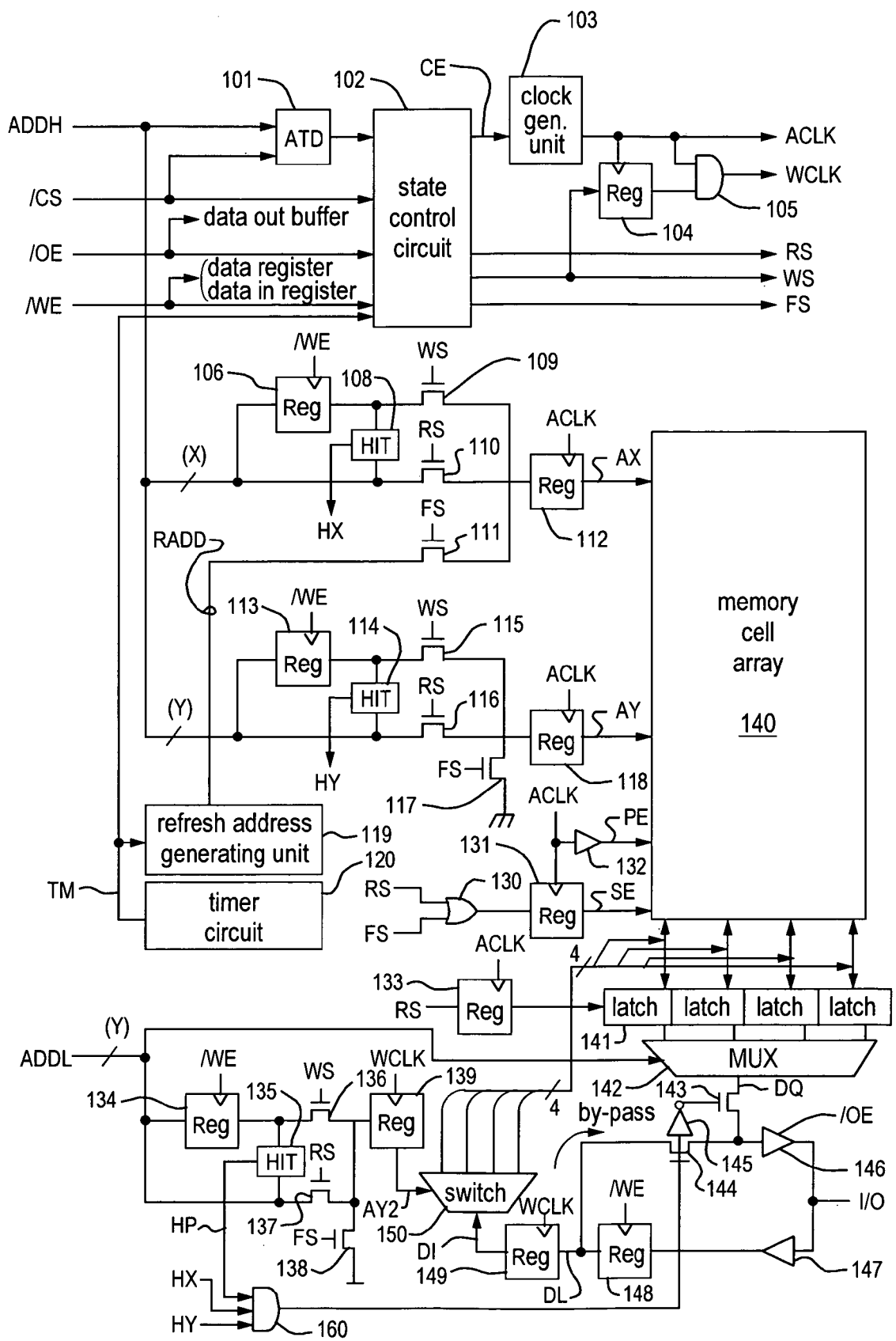
FIG. 12 is a block diagram illustrative of a feature part of the semiconductor memory device in accordance with the embodiment of the present invention.

The configuration and operation of the semiconductor memory device in accordance with this embodiment will schematically be illustrated in FIG. 12. In this drawing, an address ADDH and an address ADDL are, respectively, a higher significant address and a lower significant address. The higher significant address ADDH is an address to be fixed for read operation in the page mode, and comprises the row address and a part of the column address. The lower significant address ADDL is the remaining part of the column address to be transitioned for the operation in the page mode.

A chip select signal /CS is a most significant control signal for controlling the semiconductor memory device and for switching a stand-by mode and an active mode. The output enable signal /OE is a control signal for enabling an output of data and for controlling an active state of a data output buffer on a final stage. The write enable signal /WE is a control signal for switching the write mode and the read mode. The semiconductor memory device in accordance with this embodiment deals with the output enable signal /OE and the write enable signal /WE as instructions to provide for the operation mode of the circuits.

An address transition detector circuit 101 detects a transition of the higher significant address ADDH and outputs a one-shot pulse signal. A state control circuit 102 takes, therein from the outside, control signals such as the chip select signal /CS and generates and outputs a read statement RS, a write statement WS, a refresh statement FS, and a clock enable signal CE. This state control circuit 102 is the feature of this embodiment, and which provides a read inhibition control means for inhibiting a read operation based on the output enable signal in the write cycle with execution of the late-write.

A clock generator circuit 103 receives the clock enable signal CE and outputs a clock signal ACLK which provides for timings of refresh and read/write in the memory cycle. Description of the clock signal ACLK is set forth elsewhere herein. A register 104 hold the write statement WS by triggering the clock signal ACLK. A logic-AND gate 105 performs an AND-operation of the clock signal ACLK and a logic value of the write statement held in the register 104 for outputting a clock signal WCLK.

A register 106 takes and holds, therein, a row address component (X) of the higher significant address ADDH. A hit judgement circuit (HIT) 108 compares the address held in the register 106 to the row address component (X) of the higher significant address ADDH as externally entered, and outputs a hit signal HX upon correspondence between them.

An n-type MOS transistor 109 is controlled in a conductive state in accordance with the write statement WS for transferring the output from the register 106. An n-type MOS transistor 110 is controlled in a conductive state in accordance with the read statement RS for transferring the row address component (X) of the higher significant address ADDH. An n-type MOS transistor 111 is controlled in a conductive state in accordance with the refresh statement FS for transferring a refresh address RADD. A register 112 takes and holds, therein, signals transferred by the above-described n-type MOS transistors 109–111 and then outputs a row address AX.

A system of circuits, comprising a register 113, a hit judgement circuit 114, n-type MOS transistors 115, 116 and a register 118, corresponds to the above-described system of circuits, comprising the register 106, the hit judgement circuit 108, the n-type MOS transistors 109, 111 and the register 112. This system receives an input of a column address (Y) of the higher significant address ADDH, and then outputs a column address AY. The hit judgement circuit 114 compares the address stored in the register 113 to the column address (Y) included in the higher significant address, and outputs a hit signal HY upon correspondence between them. An n-type MOS transistor 117 corresponds to the above-described n-type MOS transistor 111, and supplies the low signal to the register 118 upon output of the refresh statement FS.

A refresh address generator unit 119 receives a timer clock TM and outputs the refresh address RADD, and which corresponds to the above-described refresh address generator circuit 8J shown in FIG. 1. A timer circuit 120 outputs the timer clock at a predetermined time interval, and which corresponds to the above-described refresh timer circuit 8G shown in FIG. 1.

A logic-OR gate 130 performs an OR-operation of the read statement RS and the refresh statement FS. A register 130 takes and holds, therein, an output from the logic-OR gate 130 by triggering the clock signal ACLK and then outputs a sense amplifier enable signal SE. A buffer 132 receives an input of the clock signal ACLK and then outputs a pre-charge enable signal PE. A register 133 takes and holds, therein, the read statement RS by triggering the clock signal ACLK.

A memory cell array 140 corresponds to the above-described memory cell array 7 shown in FIG. 1, and which comprises a matrix array of the same memory cells as DRAM. A data register 141 is to be used in the page mode, and which comprises latches, the number of which corresponds to a depth of the page. Even though illustration is omitted in FIG. 12, the same number of the data registers 141 as the number of I/O terminals is provided. In this example, the single data register 141 comprises four latches.

A multiplexer 142 selects data held in the four latches of the data register 141. An n-type MOS transistor 143 transfers data DQ as selected by the multiplexer 142. An n-type MOS transistor 144 provides a by-path for the data. An inverter 145 inverts a signal applied to a gate of the n-type MOS transistor 144 and supplies the inverted signal to a gate of the n-type MOS transistor 143. The n-type MOS transistors 143 and 144 are complementary controlled in conductive state.

A data-out buffer 146 supplies the read out data through the I/O terminal to the outside. An output state, for example, a high impedance state or a low impedance state of the data-out buffer 146, is controlled based on the output enable signal /OE. A data-in buffer 147 receives the write data signal /WE. A register 148 holds data taken from the outside in the memory cycle, based on the write enable signal /WE. A register 149 takes and holds data to be written into the memory cell in the late-write, from the above-describe register 148, by triggering the clock signal WCLK. A switch 150 supplies the data held in the register 149 to the memory cell array 140 in correspondence with the page.

A system of circuits, comprising a register 134, a hit judgement circuit 135, n-type MOS transistors 136–138 and a register 139, corresponds to the above-described system of circuits, comprising the register 113, the hit judgement circuit 114, the n-type MOS transistors 115–117 and the register 118. This system receives the lower significant address ADDL, and then outputs a column address AY2. The hit judgement circuit 135 compares the address stored in the register 134 to the lower significant address ADDL and outputs a hit signal HY upon correspondence between them. A logic-AND gate 160 performs an AND-operation of the hit signals HX, HY and HP and supplies an output signal to the above-described inverter 145.

Other than the above-described configuration elements, there are further provided an access means for executing a refresh of the memory cell array 140 accompanying to the write cycle to the access address and a write control means for rendering the access means to perform the late-write.

Figure 13:
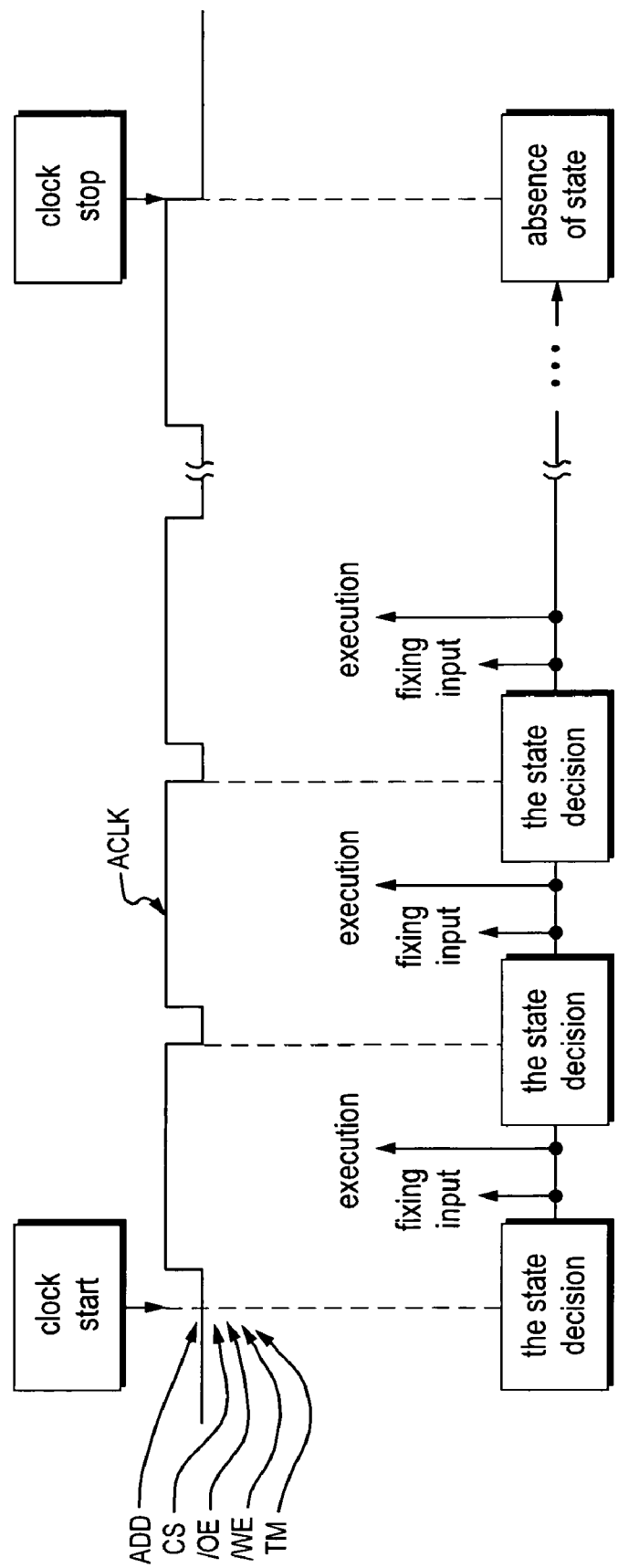
FIG. 13 is a diagram describing a concept of the basic operations (operation based on clock signal ACLK) of the semiconductor memory device in accordance with the embodiment of the present invention.

With reference to FIG. 13, the clock signal ACLK generated by the above-described clock generator unit 103 will be subsequently described. This clock signal ACLK is asynchronously started (clock start) by triggering any of the chip select signal /CS, the output enable signal /OE, the write enable signal /WE and the timer clock TM. The started clock signal ACLK provides for timings of taking and fixing input signals such as the chip select signal /CS, the output enable signal /OE and the write enable signal /WE, and also for execution of any of the read statement, the write statement, and the refresh statement.

At a timing of finishing the statement, the next statement to be executed by the next pulse of the clock signal ACLK is decided by the state control circuit 102. After no further statement to be executed is present, then the clock signal ACLK is stopped (clock stop). The clock signal ACLK provides for the timing necessary for executing the state statement decided by the state control circuit 102. The clock signal ACLK includes pulses providing for timings of fixing the input signals and pulses provides for timing of the execution of the statements.

Figure 14:
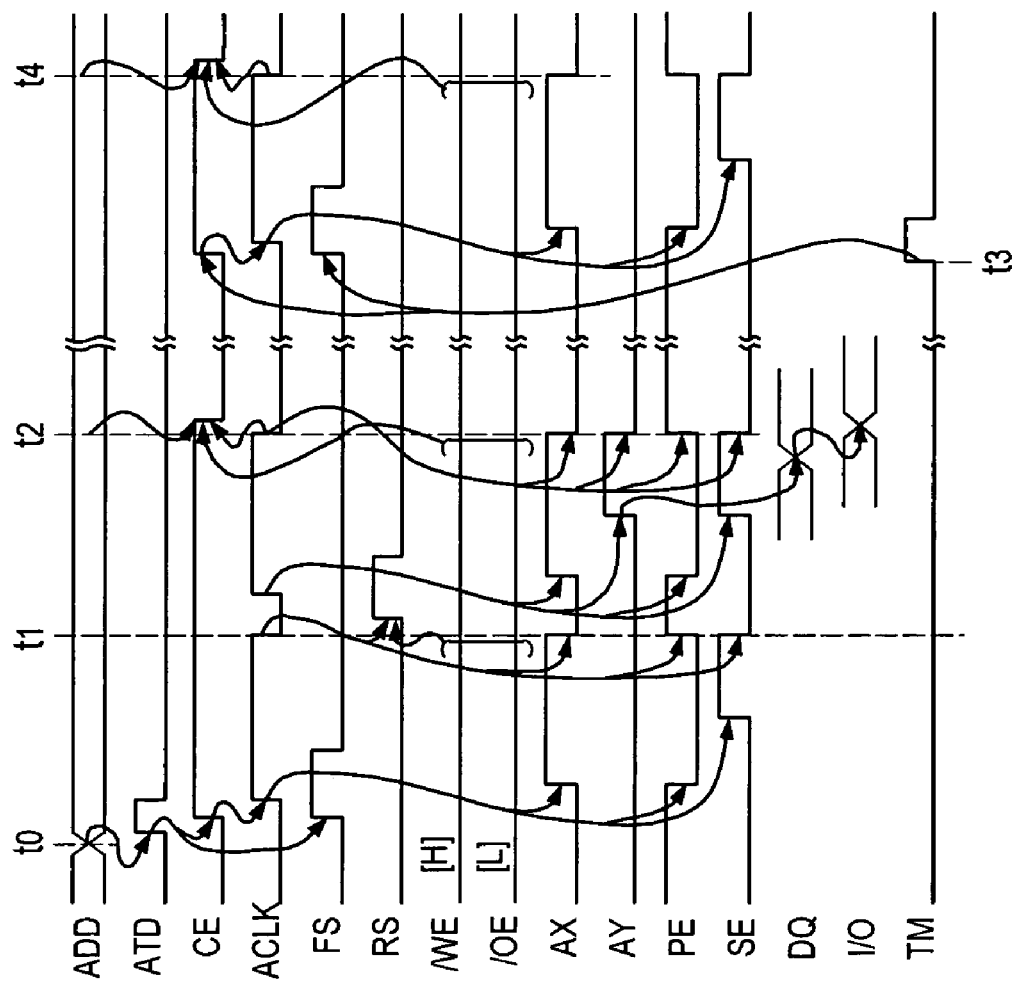
FIG. 14 is a timing chart describing a write operation of the semiconductor memory device in accordance with the embodiment of the present invention.

An example of the read operation will be described with reference to FIG. 14.

At a time t0, a transition of the address ADD is caused, whereby this address transition is detected by the address transition detector circuit 101. Upon detecting this result, the state control circuit 102 outputs the clock enable signal CE. The clock generator unit 103 receives the input of the clock enable signal CE and then outputs the clock signal ACLK, whereby the clock signal ACLK is started.

Subsequently, the state control circuit 102 outputs the refresh statement FS, while each of the input signals is fixed in the each register based on the clock signal ACLK For example, the register 112 takes, therein, the refresh address RADD through the n-type MOS transistor 111. The register 118 takes, therein, the low level signal through the n-type MOS transistor 117. The register 131 takes, therein, the high level signal corresponding to the logic value of the refresh statement FS. The register 139 takes, therein, the lower significant address ADDL through the n-type MOS transistor 137. In this case, since the refresh statement FS has been output, the register 133 receiving the read statement RS will take, therein, the low level signal, whereby each latch in the data register 141 is fixed in the inactive state.

The respective registers perform outputs of the row address AX, the pre-charge signal PE, the sense amplifier enable signal SE by triggering a pulse width of the clock signal ACLK for executing a self-refresh operation. Even illustration of the timer clock TM is omitted in FIG. 4, the request for refresh is made based on this timer clock TM.

Subsequently, at a time t1 of finishing the refresh, the state control circuit 102 determines the next state from the signal levels of the write enable signal /WE and the output enable signal /OE, and then outputs the read statement RS. At the next rising edge of the clock signal ACLK, the row address AX and the column address AY are used for the read operation, wherein a system of associated circuits is operated in response to the row address AX and the column address AY, whereby data is read out of the memory cell and supplied through a bus and the I/O terminals to the outside. At the time t2 of finishing this read operation, if a trigger (such as address transition) providing the next operation state is absent, the state control circuit 102 places the clock enable signal CE into the low level, whereby the clock generator unit 103 stops the clock signal ACLK.

Subsequently, at a time t3, a request is made for refresh by triggering the timer clock TM, whereby the state control circuit 102 generates the clock enable signal CE and the refresh statement FS, and the clock generator unit 103 generates the clock signal ACLK which fixes the row address AX for executing the refresh. At a time t4 of finishing this refresh, if a trigger providing the next operation state is absent, the clock signal ACLK is stopped and the operations are terminated.

The descriptions of the read operation have been completed above.

Figure 15:
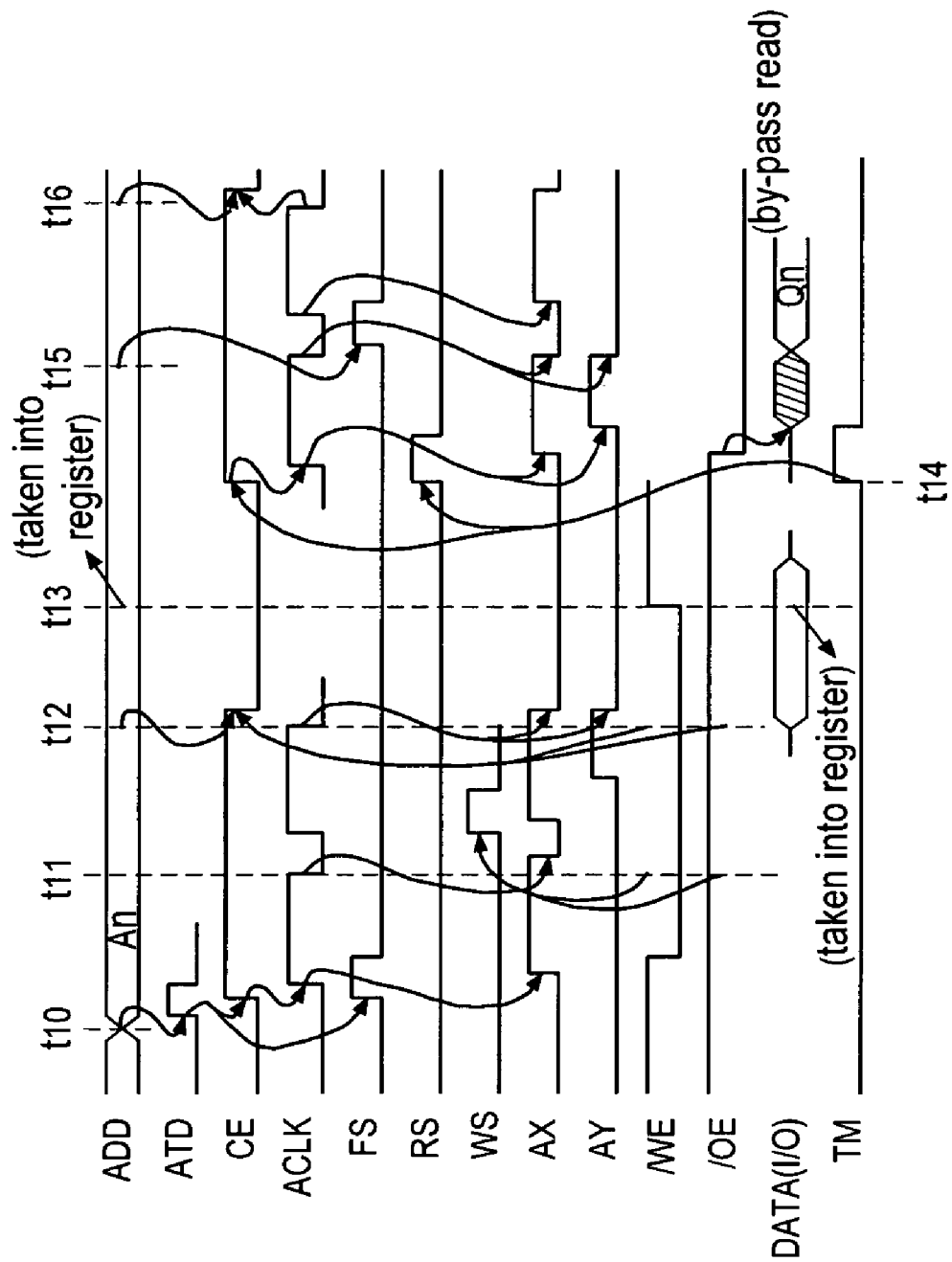
FIG. 15 is a timing chart illustrative of a write operation of the semiconductor memory device in accordance with the embodiment of the present invention.

An example of the write operation will be described with reference to FIG. 15.

At a time t10, the address ADD is transitioned to an address An. This address transition is detected by the address transition detector circuit 101. Similar to the above, the clock enable signal CE is output, and the clock signal ACLK is started. The state control circuit 102 outputs the refresh statement FS for executing the refresh.

Subsequently, at a time t11 of finishing the refresh, the output enable signal /OE is high while the write enable signal /WE is low, whereby the state control circuit 102 outputs the write statement WS. The late-write is executed at the second pulse of the clock signal ACLK started upon the transition of the address ADD. At this time, the data is written in the late-write, for which reason the write operation is completed by the single pulse of the clock signal ACLK without depending upon the pulse width of the write enable signal /WE. Subsequently, at a time t12 of finishing the late-write, the output enable signal /OE is maintained in the high level, while the write enable signal /WE is maintained in the low level, but the state control circuit 102 does not output any statement, whereby the clock signal ACLK is stopped.

Subsequently, at a time t13, the write enable signal /WE is transitioned to high, whereby addresses ADD (ADDH, ADDL) and data DATA (DIN) to be used in the next write cycle are input into the registers 112, 118, 139 and 148.

Subsequently, at a time t14, a request is made for refresh by triggering the timer clock, whereby the clock signal ACLK goes high. No read operation from the memory cell has been made in the cycle for this address An, for which reason upon the timer clock TM, the state control circuit 102 outputs the read statement, whereby the row address AX is read for executing the read operation, and then data On as data DATA is output. At this time, data DIL held in the register 148 is supplied through the n-type transistor 144 to the data-out buffer 146, whereby the data is then output to the outside by-passing the normal path such as the switch 150, the data register 141 and the multiplexer 142 (by-pass read).

Namely, the address ADD (ADDH, ADDL) read into the registers 106, 113 and 134 at the time t13 is compared to the externally entered address ADD by the hit judgement circuit for determining the correspondence between them. In this case, no transition of the address ADD has been caused, for which reason the hit signals HX, HY, and HP will be output. Upon this output, the logic-AND gate 160 supplies a high level signal to the gate of the n-type MOS transistor 144 and the inverter 145, whereby the n-type MOS transistor 144 turns ON, while the n-type MOS transistor 143 turns OFF, so that the normal path is disconnected and the by-pass path is established. The data DIL held in the register 148 is supplied through the n-type MOS transistor 144 providing the by-pass path and the data-out buffer 146 to the outside.

Subsequently, at a time t15 of finishing the read operation, the state control circuit 102 determines the next state and outputs the refresh statement FS. At the rising edge of the second pulse of the clock signal ACLK, the refresh address RADD is taken as the row address AX for executing the refresh.

At a time t16 of finishing this refresh, if a trigger for the next operation is absent, the state control circuit 102 inactivates the clock enable signal CE for stopping the clock signal ACLK.

The descriptions of the write operation have been made above.

In accordance with the above-described embodiment, the state control circuit 102 determines the state for outputting the necessary statement to inhibit the read operation based on the output enable signal /OE in the write cycle, thereby allowing the late-write to be executed following the refresh.

In the absence of any transition of the address after the late-write, the data held in the register in the previous write cycle is output through the by-pass path for preventing any miss-read due to the late-write.

Data is, in parallel, read from the memory cells subject to the page read, by triggering the output enable signal /OE for preventing any miss-read in the page read after the late-write.

The read operation is made prior to the refresh operation by triggering the internal timer allowing the high speed data read operation even if the refresh is executing by triggering the internal timer when the output enable signal /OE is activated.

The present invention should not be limited to the above-described embodiment. A variety of modifications to the embodiment is available unless the subject of the present invention is changed.

In accordance with the above-described embodiment, the refresh operation is started by triggering the address access. Notwithstanding, the refresh operation may be started by triggering the timer. Namely, the present invention is also applicable to the case shown in FIG. 1 that the refresh control circuit 8H generates the refresh control signal REFB, based on which the refresh is started by triggering the internal refresh timer.

In accordance with the above-described embodiment, such a critical state that the refresh operation is closest to the read/write operation would be that the address transition is caused immediately after the refresh has been started based on the refresh control signal REFB. In this case, the read/write operation is executed following to the refresh operation.

Accordingly, the refresh operation based on the refresh control signal REFB is substantially identical with the refresh operation by triggering the address access in accordance with the above-described embodiment.

Consequently, the present invention is thus applicable to any refresh control methods.

INDUSTRIAL APPLICABILITY

As described above, in accordance with the present invention, in the write cycle with execution of the late-write, the read operation is inhibited based on the output enable signal for preventing the late-write from disturbing the refresh operation and also for reducing a current consumption in the write cycle with execution of the late-write.

What is claimed is:

1. A semiconductor memory device having a memory cell array comprising memory cells which need refresh scheduling and receiving asynchronously a write request and write data together with an access address, wherein the semiconductor memory device comprises:
   an access means for executing a refresh of said memory cell array after a write request to write data to the access address;
   a write control means for controlling said access means to execute a late write operation, after said write request has been issued, using said access address and said data given in connection with said write request; and
   a read inhibit control means for inhibiting a read operation based on an output enable signal, said output enable signal being provided in a write cycle in which execution of said late write operation occurs.

2. The semiconductor memory device as claimed in claim 1, wherein retained data, which are to be written through said late write operation, are read out if said output enable signal is activated without any transition of said access address in said write cycle having said execution of said late write operation.

3. The semiconductor memory device as claimed in claim 1, wherein data are read out from a memory cell subject to an access in a page mode by triggering an output enable signal in the write cycle.

4. The semiconductor memory device as claimed in claim 1, wherein data are read out from a memory cell designated by the current cycle prior to a refresh in a cycle free of any read operation.

5. A method for manufacturing a semiconductor memory device having a memory cell array comprising memory cells which need refresh scheduling and receiving a write request and write data together with an access address, wherein the method comprising steps of:
   executing a refresh of said memory cell array after a write request to write data to the access address;
   performing a late write operation, after said write request has been issued, using said access address and said data given in connection with said write request; and
   inhibiting a read operation based on an output enable, said output enable signal being provided in a write cycle in which execution of said late write operation occurs.

6. The method as claimed in claim 5, further comprising a step of:
   reading out retained data, which are to be written through said late write operation, is said output enable signal is activated without any transition of said access address to said write cycle having said execution of said late write operation.

7. The method as claimed in claim 5, further comprising a step of:
   reading out data from a memory cell subject to an access in a page mode by triggering an output enable signal in the write cycle.

8. The method as claimed in claim 5, further comprising a step of:
   reading out data from a memory cell designated by the current cycle prior to a refresh in a cycle free of any read operation.

* * * * *